(12) United States Patent
Xu et al.

(10) Patent No.: US 12,225,798 B2
(45) Date of Patent: Feb. 11, 2025

(54) TRANSPARENT DISPLAY SUBSTRATES, TRANSPARENT DISPLAY PANELS AND DISPLAY DEVICES

(71) Applicant: KunShan Go-Visionox Opto-Electronics Co., Ltd., Kunshan (CN)

(72) Inventors: Chuanzhi Xu, Kunshan (CN); Lu Zhang, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 613 days.

(21) Appl. No.: 17/495,152

(22) Filed: Oct. 6, 2021

(65) Prior Publication Data

US 2022/0028900 A1    Jan. 27, 2022

Related U.S. Application Data

(63) Continuation of application No. PCT/CN2020/095455, filed on Jun. 10, 2020.

(30) Foreign Application Priority Data

Sep. 29, 2019   (CN) .......................... 201921646620.7

(51) Int. Cl.
*H10K 59/35* (2023.01)
*H01L 27/12* (2006.01)
*H10K 59/131* (2023.01)

(52) U.S. Cl.
CPC ......... *H10K 59/353* (2023.02); *H01L 27/124* (2013.01); *H10K 59/131* (2023.02); *H10K 59/35* (2023.02); *H01L 27/1218* (2013.01)

(58) Field of Classification Search
CPC .... H01L 27/124; H10K 59/131; H10K 59/35; H10K 59/353
See application file for complete search history.

(56) References Cited

U.S. PATENT DOCUMENTS

| 2003/0038589 | A1  | 2/2003 | Kim et al. |
| 2019/0096324 | A1  | 3/2019 | Soda |
| 2021/0041923 | A1* | 2/2021 | Bai ...................... H10K 59/353 |

FOREIGN PATENT DOCUMENTS

| CN | 201516181 U | 6/2010 |
| CN | 107768545 A | 3/2018 |

(Continued)

OTHER PUBLICATIONS

International Search Report issued on Sep. 16, 2020 in corresponding International application No. PCT/CN2020/095455; 4 pages.

(Continued)

*Primary Examiner* — Peter M Albrecht
(74) *Attorney, Agent, or Firm* — Maier & Maier, PLLC

(57) ABSTRACT

A transparent display substrate, a transparent display panel and a display device. The display substrate includes at least one pixel unit. The at least one pixel unit includes at least three sub-pixel groups emitting light of different colors. The sub-pixel groups includes at least two sub-pixels, and the sub-pixels include a first electrode, a light-emitting structure block located on the first electrode, and a second electrode located on the light-emitting structure block. In the at least one pixel unit, two first electrodes of two adjacent sub-pixels in a sub-pixel group are electrically connected by a first connecting portion, two first electrodes of two sub-pixels in another of the sub-pixel groups are electrically connected by a second connecting portion. The second connecting portion at least partially surrounds sides of the sub-pixels in other (Continued)

sub-pixel groups. The first connecting portion and the second connecting portion are located in a same layer.

20 Claims, 4 Drawing Sheets

(56) References Cited

FOREIGN PATENT DOCUMENTS

| | | | | | |
|---|---|---|---|---|---|
| CN | 108648675 | A | | 10/2018 | |
| CN | 109192076 | A | | 1/2019 | |
| CN | 110148621 | A | | 8/2019 | |
| CN | 110189639 | A | * | 8/2019 | ........... H10K 59/353 |
| CN | 110289298 | A | | 9/2019 | |
| CN | 210516181 | U | | 5/2020 | |
| JP | 2011129510 | A | | 6/2011 | |
| JP | 2019061777 | A | | 4/2019 | |
| KR | 1020160113484 | A | | 9/2016 | |

OTHER PUBLICATIONS

Written Opinion of the International Searching Authority issued on Sep. 16, 2020 in corresponding International application No. PCT/CN2020/095455; 5 pages.

Extended European Search Report Issued on Oct. 24, 2022, in corresponding European Patent Application No. 20868987.7, 10 pages.

Japanese Office Action Issued on Jul. 19, 2022, in corresponding Japanese Application No. 2021-562048, 8 pages.

* cited by examiner

TRANSPARENT DISPLAY SUBSTRATES, TRANSPARENT DISPLAY PANELS AND DISPLAY DEVICES

CROSS REFERENCE TO RELATED APPLICATIONS

This application is a continuation application of International Patent Application No. PCT/CN2020/095455, filed on Jun. 10, 2020, which claims priority to Chinese Patent Application No. 201921646620.7, titled "TRANSPARENT DISPLAY SUBSTRATE AND DISPLAY DEVICE", filed on Sep. 29, 2019, the contents of all of which are incorporated herein by reference.

TECHNICAL FIELD

This application relates to the field of display technologies, and in particular, to transparent display substrates, transparent display panels and display devices.

BACKGROUND

With rapid development of electronic devices, users have higher and higher requirements for screen-to-body ratio, and thus full-screen display of electronic devices has drawn more and more attention in the industry. Traditional electronic devices such as mobile phones and tablet computers need to integrate a front camera, an earpiece, an infrared sensing element, etc., which, therefore, can be disposed in a notched region by notching on a display screen. However, the notched region, for example, a bang region, cannot display images. Alternatively, a camera and the like may be arranged by opening on a screen. In this way, for electronic devices that can implement a camera function, external light may enter a photosensitive element located below the screen through the opening on the screen. However, these electronic devices do not have full screens in a true sense, so that display cannot be performed in all regions of the entire screen, for example, images cannot be displayed in a camera region.

SUMMARY

According to a first aspect of embodiments of the present application, a transparent display substrate is provided. The display substrate includes at least one pixel unit. The at least one pixel unit comprises at least three sub-pixel groups emitting light of different colors. Each of the sub-pixel groups comprises at least two sub-pixels, and each of the sub-pixels comprises a first electrode, a light-emitting structure block located on the first electrode, and a second electrode located on the light-emitting structure block. In the at least one pixel unit, two first electrodes of two adjacent sub-pixels in one of the sub-pixel groups are electrically connected by a first connecting portion, two first electrodes of two sub-pixels in another one of the sub-pixel groups are electrically connected by a second connecting portion. The second connecting portion at least partially surrounds sides of the sub-pixels in other sub-pixel groups, and the first connecting portion and the second connecting portion are located in a same layer.

According to a second aspect of the embodiments of the present application, a transparent display panel is provided, including the transparent display substrate as described above and an encapsulation layer disposed on the transparent display substrate.

According to a third aspect of the embodiments of the present application, a display device is provided, including a first display region and a second display region. The first display region is a transparent display region, and a photosensitive component is disposed below the first display region. The second display region is a transparent display region or a non-transparent display region. The first display region and the second display region are provided with the transparent display substrate as described above.

In the transparent display substrate, the transparent display panel, and the display device provided by the embodiments of the present application, first electrodes of two adjacent sub-pixels in one sub-pixel group in the pixel unit of the transparent display substrate are electrically connected by a first connecting portion, and first electrodes of two sub-pixels in another one sub-pixel group are electrically connected by a second connecting portion. The second connecting portion at least partially surrounds sides of one or more sub-pixels in other sub-pixel groups in the pixel unit. Therefore, the first connecting portion and the second connecting portion can be avoided from being intersected. For example, an intersection of connecting portions from different sub-groups can be avoided, and first electrodes of all sub-pixels in a same sub-pixel group can be electrically connected. Therefore, all the sub-pixels in a same sub-pixel group can be driven by only one pixel circuit, which can reduce a number of pixel circuits in the transparent display substrate, effectively relieve the diffraction and superposition caused when light is transmitted through the transparent display substrate, and further promote the quality of images taken by a camera disposed on or below the side of the transparent display substrate away from external light, so as to avoid image distortion. In addition, since the first connecting portion and the second connecting portion in a same sub-pixel group are disposed on a same layer, the first connecting portion and the second connecting portion may be formed in one procedure, which is beneficial to reduce the complexity of a manufacturing process.

DETAILED DESCRIPTION

Figure 1:
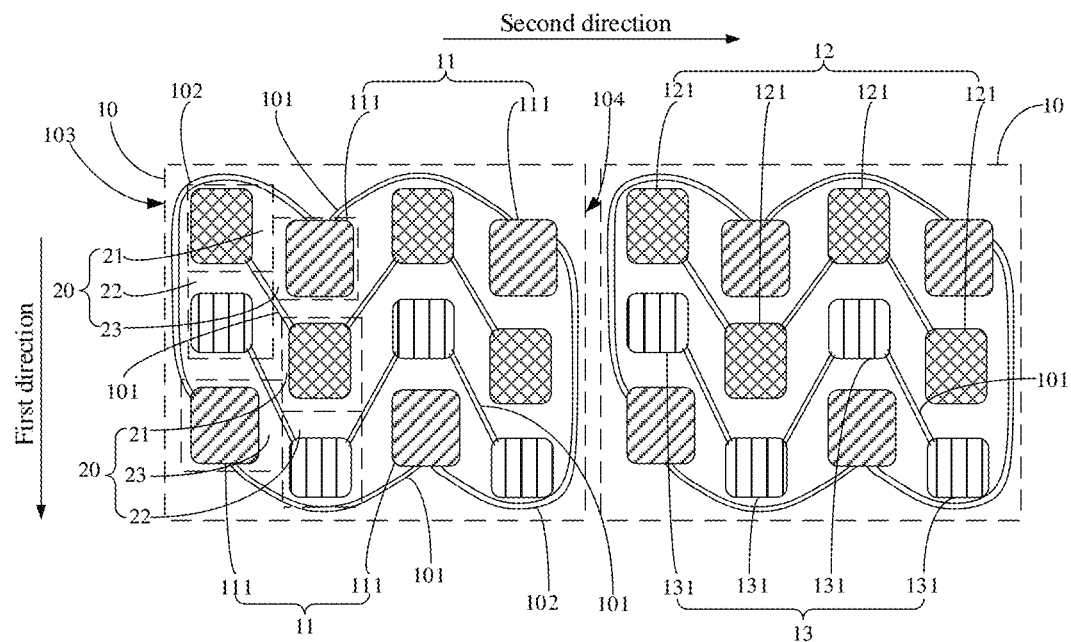
FIG. 1 is a partial schematic diagram illustrating an arrangement of sub-pixel groups in a transparent display substrate according to an embodiment of the present application.

Exemplary embodiments will be described in detail herein, with the illustrations thereof represented in the drawings. When the following descriptions involve the drawings, like numerals in different drawings refer to like or similar elements unless otherwise indicated. The embodiments described in the following exemplary embodiments do not represent all embodiments consistent with the present application. Rather, they are merely examples of apparatuses consistent with some aspects of the present application as detailed in the appended claims.

In a smart electronic device such as a mobile phone or a tablet computer, one or more photosensitive components such as a front camera, a light sensor, etc., need to be integrated therein. In this case, the full screen display of an electronic device is achieved generally by providing a transparent display region in the above electronic device.

However, light received by a camera through the transparent display region is poor, and even image distortion may appear during the acquisition of images. The inventor has discovered through research that the reason for this problem is that a structure of the transparent display region in the electronic device is relatively complex, which causes external light to undergo a relatively complex diffraction intensity distribution when passing through the transparent display region, resulting in diffraction fringes which affect the normal operation of the photosensitive components. For example, when sub-pixels in the transparent display region are actively driven, each sub-pixel corresponds to one pixel circuit, resulting in a complex structure of the transparent display region. In this case, when external light passes through the display screen, obvious diffraction will occur at a boundary between various components in different pixel circuits, which causes distortion of images taken by the camera.

In order to solve the above-mentioned problems, embodiments of the present application provide a transparent display substrate, a transparent display panel, and a display device.

The transparent display substrate, the transparent display panel, and the display device in the embodiments of the present application will be described in detail below with reference to the accompanying drawings. In the case of no conflict, features in the following embodiments and implementations may be supplemented or combined with each other.

Referring to FIGS. 1 to 5, a transparent display substrate provided by an embodiment of the present application includes a plurality of pixel units 10. Each of the pixel units 10 includes at least three sub-pixel groups emitting light of different colors respectively. Each of the sub-pixel groups includes at least two sub-pixels. Each of the sub-pixels includes a first electrode, a light-emitting structure block located on the first electrode, and a second electrode located on the light-emitting structure block.

In one or more of the pixel units 10, first electrodes of two adjacent sub-pixels (for example, two adjacent first sub-pixels 121, 131) in one sub-pixel group (for example the sub-pixel groups 12, 13) are electrically connected by a first connecting portion 101, and first electrodes of at least two sub-pixels (for example, first sub-pixels 111) in another sub-pixel group (for example, sub-pixel group 11) are electrically connected by a second connecting portion 102, which at least partially surrounds sides of the sub-pixels in other sub-pixel groups, i.e., the sub-pixel group not the sub-pixel group 11, for example the sub-pixel groups 12, 13, in the pixel unit 10. The first connecting portion(s) 101 and the second connecting portion(s) 102 are located in a same layer.

In the pixel unit 10, two first electrodes of the two adjacent sub-pixels 121 or 131 in the sub-pixel group 12 or 13 are electrically connected by the first connecting portion 101. Two first electrodes of the two sub-pixels 111 in another one of the sub-pixel groups 11 are electrically connected by the second connecting portion 102, which is at least partially surrounding sides of the sub-pixels 121, 131 in other sub-pixel groups 12, 13.

Since in a sub-pixel group in the pixel unit 10, the second connecting portion 102 for connecting two sub-pixels 111 at least partially surrounds sides of one or more sub-pixels 121, 131 in other sub-pixel groups, two first electrodes of the two sub-pixels 111 electrically connected by the second connecting portion 102 may be first electrodes of two non-adjacent sub-pixels 111, for example, first electrodes of two sub-pixels in different rows. Since in a sub-pixel group, first electrodes of two adjacent sub-pixels are electrically connected by the first connecting portion, and first electrodes of two non-adjacent sub-pixels are electrically connected by the second connecting portion, the first connecting portion and the second connecting portion can be avoided from being intersected, for example, an intersection of connecting portions from different sub-groups can be avoided, while first electrodes of all sub-pixels in a same sub-pixel group can be electrically connected.

Figure 2:
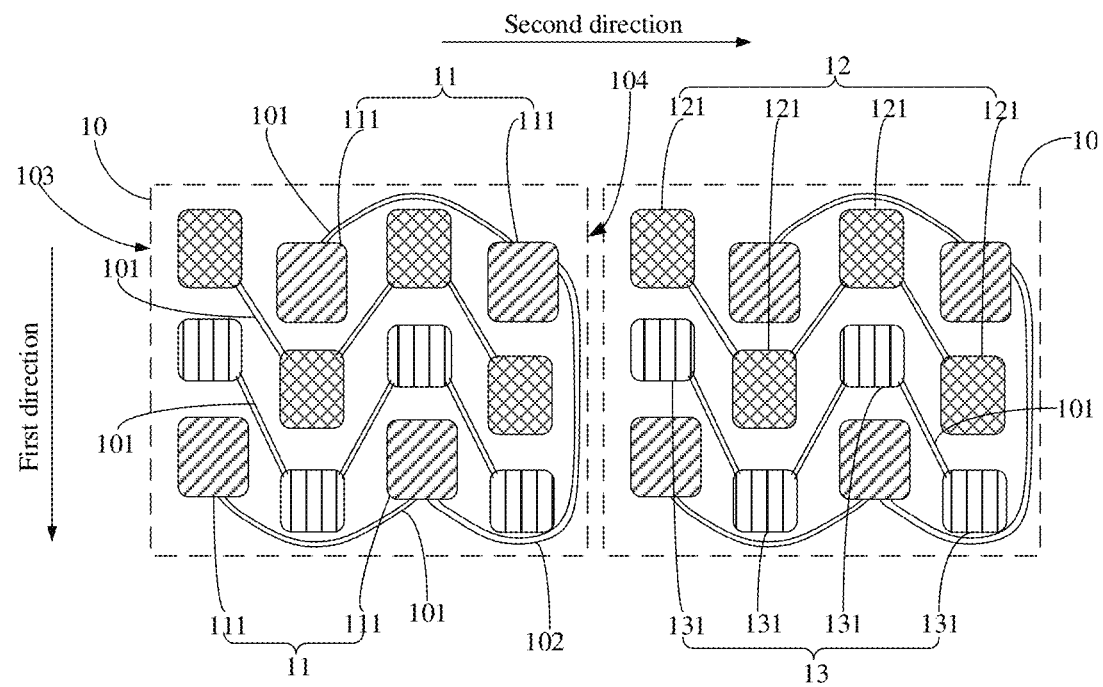
FIG. 2 is a partial schematic diagram illustrating an arrangement of sub-pixel groups in a transparent display substrate according to another embodiment of the present application.

In the transparent display substrates shown in FIGS. 1 to 2, each pixel unit 10 includes four first sub-pixels 111, four second sub-pixels 121, and four third sub-pixels 131. The four first sub-pixels 111 form a sub-pixel group, the four second sub-pixels 121 form a sub-pixel group, and the four third sub-pixels 131 form a sub-pixel group. In the transparent display substrates shown in FIGS. 3 and 4, each pixel unit 10 includes six first sub-pixels 111, six second sub-pixels 121, and six third sub-pixels 131. The six first sub-pixels 111 form a sub-pixel group, the six second sub-pixels 121 form a sub-pixel group, and the six third sub-pixels 131 form a sub-pixel group. In the transparent display substrate shown in FIG. 5, each pixel unit 10 includes ten first sub-pixels 111, ten second sub-pixels 121, and ten third sub-pixels 131. The ten first sub-pixels 111 form a sub-pixel group, the ten second sub-pixels 121 form a sub-pixel group, and the ten third sub-pixels 131 form a sub-pixel group. It is to be noted that the above numbers of sub-pixels are examples only and are not limiting.

In the transparent display substrates shown in FIGS. 1 to 5, in each of the sub-pixel groups, two adjacent first sub-pixels 111 in a same row are electrically connected by the first connecting portion 101, two adjacent second sub-pixels 121 are electrically connected by the first connecting portion 101, and two adjacent third sub-pixels 131 are electrically connected by the first connecting portion 101. In the transparent display substrates shown in FIGS. 1, 2 and 3, the second connecting portion 102 connecting two first sub-pixels 111 at least partially surrounds sides of one or more second sub-pixels 121 and one or more third sub-pixels 131. In the display substrates shown in FIGS. 4 and 5, the second connecting portion 102 connecting two first sub-pixels 111 at least partially surrounds sides of one or more second sub-pixels 121 and one or more third sub-pixels 131, the second connecting portion 102 connecting two second sub-pixels 121 at least partially surrounds sides of one or more first sub-pixels 111 and one or more third sub-pixels 131, and the second connecting portion 102 connecting two third sub-pixels 131 at least partially surrounds sides of one or more first sub-pixels 111 and one or more second sub-pixels 121.

In the transparent display substrates provided by the embodiments of the present application, first electrodes of two adjacent sub-pixels in one sub-pixel group in the pixel unit 10 are electrically connected by the first connecting portion 101, first electrodes of at least two sub-pixels in another one sub-pixel group are electrically connected by the second connecting portion 102, the second connecting portion 102 at least partially surrounds sides of one or more sub-pixels in other sub-pixel groups in the pixel unit 10. In this way, the first connecting portion 101 and the second connecting portion 102 can be avoided from being intersected. For example, an intersection of connecting portions from different sub-groups can be avoided. At a same time, sub-pixels in a same sub-pixel group can be electrically connected, so that all the sub-pixels in a same sub-pixel group may be driven by only one pixel circuit. This can reduce a number of pixel circuits in the transparent display substrate, thus effectively relieve the diffraction and superposition caused when light is transmitted through the transparent display substrate, and further promote the quality of images taken by a camera disposed on or below the side of the transparent display substrate away from external light, so as to avoid image distortion. In addition, since the first connecting portion(s) 101 and the second connecting portion(s) 102 in a same sub-pixel group are disposed in a same layer, the first connecting portion(s) 101 and the second connecting portion(s) 102 may be formed in one procedure, which is beneficial to reduce the complexity of a manufacturing process.

The first connecting portion(s) 101 and the second connecting portion(s) 102 are located in a same layer. It should be understood that, in order to enable sub-pixels to work normally, the first connecting portion(s) 101 does not intersect with the second connecting portion(s) 102. For example, a first connecting portion in one sub-pixel group does not intersect with a second connecting portion in another sub-pixel group.

Optionally, referring to FIGS. 1 to 5, in the pixel unit 10, at least one sub-pixel group includes at least two sub-groups arranged along a first direction. Each of the at least two sub-groups includes at least two sub-pixels arranged at intervals along a second direction, where the first direction intersects with the second direction. Two adjacent sub-groups in a same sub-pixel group have sub-groups in other sub-pixel groups disposed therebetween. Besides, two adjacent sub-pixels in a same sub-group are electrically connected by the first connecting portion 101. In two adjacent sub-groups in a same sub-pixel group, a first electrode in one sub-group is connected to a first electrode in the other sub-group by the second connecting portion 102, and the second connecting portion 102 at least partially surrounds sides of one or more sub-groups in other sub-pixel groups.

In the embodiments of the present application, that at least two sub-groups in a same sub-pixel group are arranged along the first direction refers to that the at least two sub-groups are arranged substantially along the first direction when each is regarded as a whole. That at least two sub-pixels in a same sub-group are arranged at intervals along the second direction refers to that the at least two sub-pixels in the sub-group are arranged substantially along the second direction, where central axes of the at least two sub-pixels in the second direction may overlap, or may be spaced by a certain distance.

In this way, first electrodes of two adjacent sub-pixels in a same sub-group are electrically connected by the first connecting portion(s); and in at least two sub-groups in a same sub-pixel group, first electrodes of sub-pixels in two adjacent sub-groups are electrically connected by the second connecting portion(s). Thus, in each sub-pixel group in the pixel units 10, first electrodes of all sub-pixels may be electrically connected, while the first connecting portion(s) and the second connecting portion(s) are at reasonable positions and not intersected.

In the pixel units 10 of the transparent display substrates shown in FIGS. 1 and 2, the sub-pixel group formed by the first sub-pixels 111 includes two first sub-groups 11, and each of the first sub-groups 11 includes two first sub-pixels 111. The sub-pixel group formed by the second sub-pixels 121 includes one second sub-group 12, and the second sub-group 12 includes four second sub-pixels 121. The sub-pixel group formed by the third sub-pixels 131 includes one third sub-group 13, and the third sub-group 13 includes four third sub-pixels 131. The second sub-group 12 and the third sub-group 13 are located between the two first sub-groups 11. In each of the sub-groups 11, 12 and 13, first electrodes of two adjacent first sub-pixels 111, two adjacent second sub-pixels 121 and two adjacent third sub-pixels 131 are electrically connected by the first connecting portions 101. A first electrode in one of the two first sub-groups 11 is electrically connected to a first electrode of the other one of the two first sub-groups 11 by the second connecting portion 102, and the second connecting portion 102 at least partially surrounds sides of the second sub-group 12 and the third sub-group 13.

Figure 4:
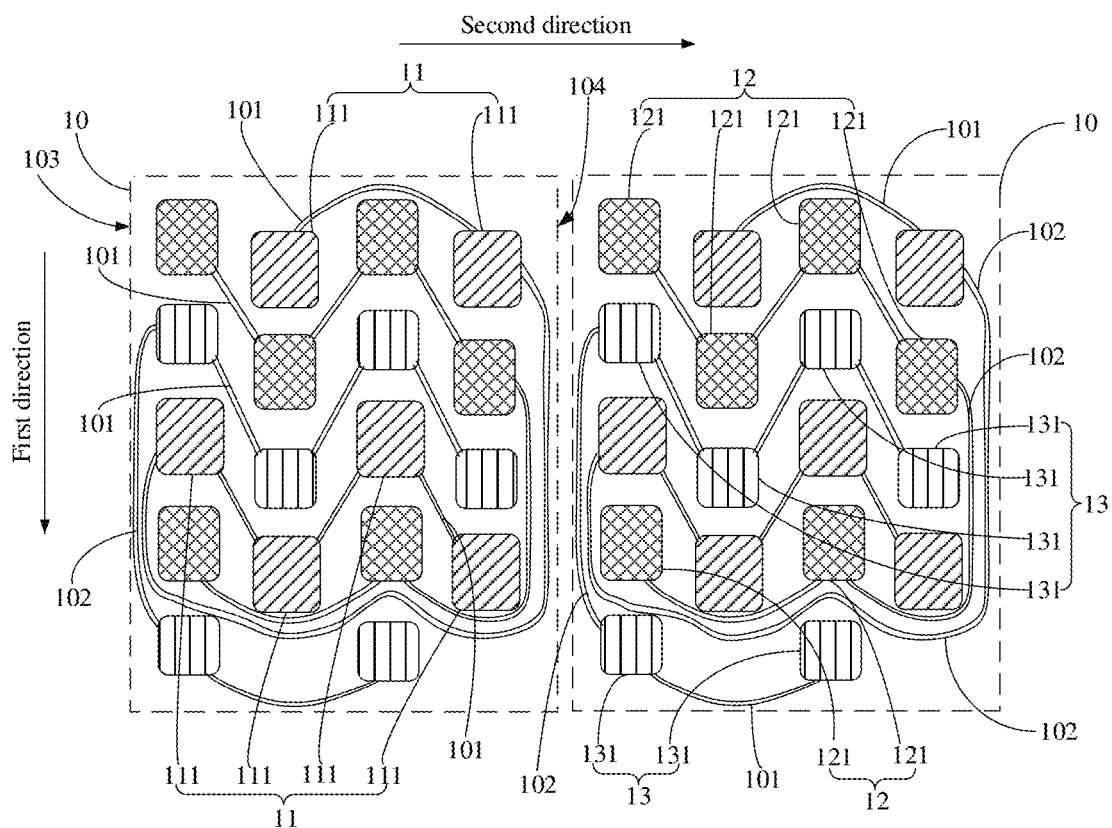
FIG. 4 is a partial schematic diagram illustrating an arrangement of sub-pixel groups in a transparent display substrate according to another embodiment of the present application.
Figure 5:
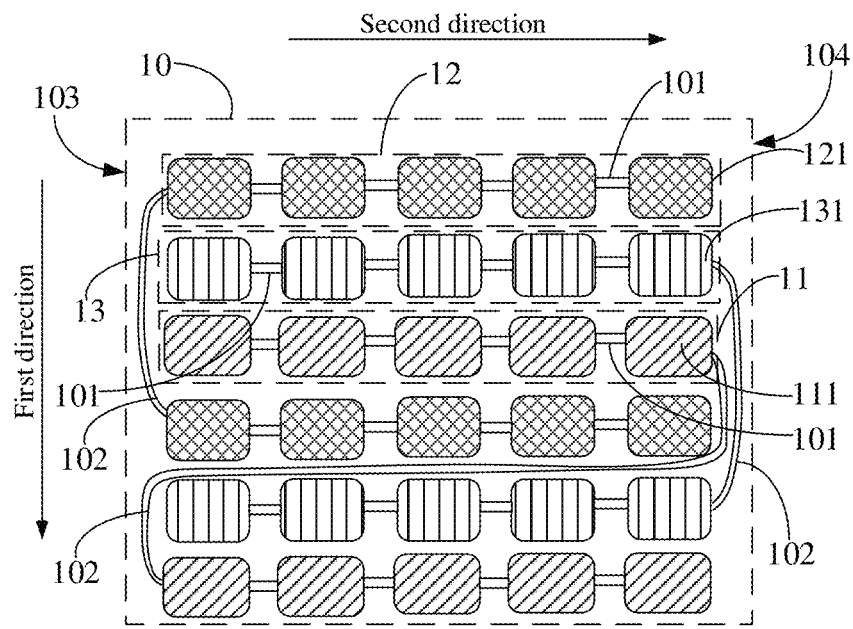
FIG. 5 is a partial schematic diagram illustrating an arrangement of sub-pixel groups in a transparent display substrate according to another embodiment of the present application.

In the pixel unit 10 of the transparent display substrates shown in FIGS. 4 and 5, the sub-pixel group formed by the first sub-pixels 111 includes two first sub-groups 11, the sub-pixel group formed by the second sub-pixels 121 includes two second sub-groups 12, and the sub-pixel group formed by the third sub-pixels 131 includes two third sub-groups 13. One second sub-group 12 and one third sub-group 13 are disposed between the two first sub-groups 11, where a first electrode in one of the two first sub-groups 11 is electrically connected to a first electrode in the other one of the two first sub-groups 11 by the second connecting portion 102, and the second connecting portion 102 at least partially surrounds sides of the second sub-group 12 and the third sub-group 13. One first sub-group 11 and one third sub-group 13 are disposed between the two second sub-groups 12, where a first electrode in one second sub-group 12 is electrically connected to a first electrode in the other second sub-group 12 by the second connecting portion 102, and the second connecting portion 102 at least partially surrounds sides of the first sub-group 11 and the third sub-group 13. One first sub-group 11 and one second sub-group 12 are disposed between the two third sub-groups 13, where a first electrode in one third sub-group 13 is electrically connected to a first electrode in the other third sub-group 13 by the second connecting portion 102, and the second connecting portion 102 at least partially surrounds sides of the first sub-group 11 and the second sub-group 12.

Optionally, a first pixel unit 10 includes three sub-pixel groups emitting light of different colors, which are a sub-pixel group emitting light of a first color, a sub-pixel group emitting light of a second color, and a sub-pixel group emitting light a third color, respectively. The sub-pixel group emitting light of the first color includes at least two second sub-pixels 121 of the first color. The sub-pixel group emitting light of the second color includes at least two third sub-pixels 131 of the second color. The sub-pixel group emitting light of the third color includes at least two first sub-pixels 111 of the third color.

The arrangement of the sub-pixels in the three sub-pixel groups emitting light of different colors and the manner for disposing the second connecting portion(s) may have the following cases. Details will be described below.

In the first case, in the three sub-pixel groups emitting light of different colors, the sub-pixel group emitting light of the first color includes one second sub-group 12 emitting light of the first color, the sub-pixel group emitting light of the second color includes one third sub-group 13 emitting light of the second color, and the sub-pixel group emitting light of the third color includes two first sub-groups 11 emitting light of the third color. The second sub-group 12 emitting light of the first color and the third sub-group 13 emitting light of the second color are disposed between the two first sub-groups 11 emitting light of the third color. The pixel unit 10 includes a first side 103, and a second side 104 opposite to the first side 103. The first side 103 is opposite to the second side 104 along the second direction, or the first side 103 and the second side 104 are two sides of the pixel unit 10 parallel to the first direction. In this case, there may include the following two manners for disposing the second connecting portion 102.

In the first manner, in the two first sub-groups 11 emitting light of the third color, a first electrode adjacent to the first side 103 in one first sub-group 11 is electrically connected to a first electrode adjacent to the first side 103 in the other first sub-group 11 by the second connecting portion 102. Optionally, a first electrode adjacent to the second side 104 in one first sub-group 11 is electrically connected to a first electrode adjacent to the second side 104 in the other first sub-group 11 by the second connecting portion 102. A distance between the first electrode adjacent to the first side 103 in one sub-group and the first side 103 is smaller than distances between other first electrodes in the same sub-group and the first side 103. A distance between the first electrode adjacent to the second side 104 in one sub-group and the second side 104 is smaller than distances between other first electrodes in the same sub-group and the second side 104.

In the pixel unit 10 shown in FIG. 2, in the two first sub-groups 11 emitting light of the third color, a first electrode adjacent to the second side 104 in one first sub-group 11 is electrically connected to a first electrode adjacent to the second side 104 in the other first sub-group 11 by the second connecting portion 102. In other embodiments, a first electrode adjacent to the first side 103 in one first sub-group 11 may be electrically connected to a first electrode in the other first sub-group 11 and adjacent to the first side 103 by the second connecting portion 102.

In this way, in a same sub-pixel group, two first electrodes in two adjacent sub-groups are electrically connected by one second connecting portion 102, therefore, a number of the second connecting portions 102 is minimal. First electrodes located on a same side in two sub-groups are electrically connected, which can make the length of the second connecting portion 102 relatively shorter. Therefore, the manner mentioned above for disposing the second connecting portions helps to improve the transparency of the transparent display substrate, reduce the structural complexity of the transparent display substrate, and further decrease the diffraction and superposition when external light is transmitted through the transparent display panel.

In the second manner, in the two first sub-groups 11 emitting light of the third color, a first electrode adjacent to the first side 103 in one first sub-group 11 is electrically connected to a first electrode adjacent to the first side 103 in the other first sub-group 11 by the second connecting portion 102. Besides, a first electrode adjacent to the second side 104 in one first sub-group 11 is electrically connected to a first electrode adjacent to the second side 104 in the other first sub-group 11 by the second connecting portion 102.

Figure 3:
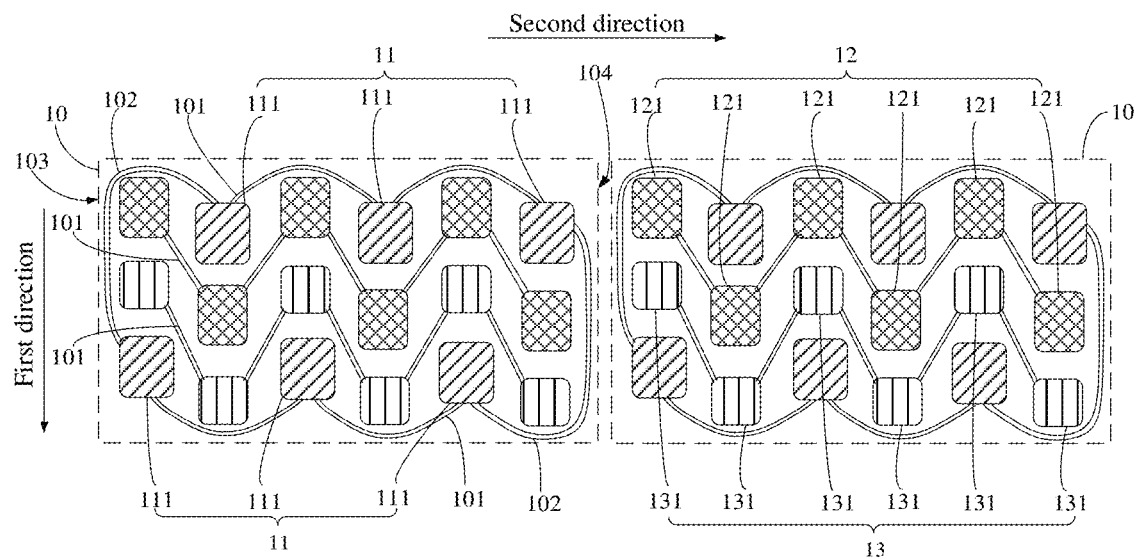
FIG. 3 is a partial schematic diagram illustrating an arrangement of sub-pixel groups in a transparent display substrate according to another embodiment of the present application.

In the pixel units 10 shown in FIGS. 1 and 3, in the two first sub-groups 11 emitting light of the third color, a first electrode adjacent to the first side 103 in one first sub-group 11 is electrically connected to a first electrode adjacent to the first side 103 in the other first sub-group 11 by the second connecting portion 102, and a first electrode adjacent to the second side 104 in one first sub-group 11 is electrically connected to a first electrode adjacent to the second side 104 in the other first sub-group 11 by the second connecting portion 102.

In this way, the first connecting portions 101, the second connecting portions 102 and the first electrodes of the two first sub-groups 11 are connected to form a closed loop. Thus, in a case that a pixel circuit corresponding to the sub-pixel group to which the two first sub-groups 11 belong is electrically connected to one of the first connecting portions, the second connecting portions or the first electrodes, the pixel circuit can drive the sub-pixel group, which makes the connection between the sub-pixel group and corresponding pixel circuit more flexible.

In the second case, the sub-pixel group emitting light of the first color includes two second sub-groups 12 emitting light of the first color, the sub-pixel group emitting light of the second color includes two third sub-groups 13 emitting light of the second color, and the sub-pixel group emitting light of the third color includes two first sub-groups 11 emitting light of the third color. Between two sub-groups emitting light of a same color, sub-groups emitting the other two colors are disposed. That is, the second sub-group 12 emitting light of the first color and the third sub-group 13 emitting light of the second color are disposed between the two first sub-groups 11 emitting light of the third color. The second sub-group 12 emitting light of the first color and the first sub-group 11 emitting light of the third color are disposed between the two third sub-groups 13 emitting light of the second color. The third sub-group 13 emitting light of the second color and the first sub-group 11 emitting light of the third color are disposed between the two second sub-groups 12 emitting light of the first color. The pixel unit 10 includes a first side 103, and a second side 104 opposite to the first side 103. The first side 103 is parallel to the second side 104 along the first direction.

Referring to FIG. 4, in the two second sub-groups 12 emitting light of the first color, a first electrode adjacent to the second side 104 in one second sub-group 12 is electrically connected to a first electrode adjacent to the second side 104 in the other second sub-group 12 by the second connecting portion 102. In the two third sub-groups 13 emitting light of the second color, a first electrode adjacent to the first side 103 in one third sub-group 13 is electrically connected to a first electrode adjacent to the first side 103 in the other third sub-group 13 by the second connecting portion 102. In the two first sub-groups 11 emitting light of the third color, a first electrode adjacent to the first side 103 in one first sub-group 11 is electrically connected to a first electrode adjacent to the second side 104 in the other first sub-group 11 by the second connecting portion 102 and the second connecting portion 102 passes through a region between the other first sub-group 11 and the third sub-group 13 adjacent to the other first sub-group 11.

Referring to FIG. 5, in the two second sub-groups 12 emitting light of the first color, a first electrode adjacent to the first side 103 in one second sub-group 12 is electrically connected to a first electrode adjacent to the first side 103 in the other second sub-group 12 by the second connecting portion 102. In the two third sub-groups 13 emitting light of the second color, a first electrode adjacent to the second side 104 in one third sub-group 13 is electrically connected to a first electrode adjacent to the second side 104 in the other third sub-group 13 by the second connecting portion 102. In the two first sub-groups 11 emitting light of the third color, a first electrode adjacent to the first side 103 in one first sub-group 11 is electrically connected to a first electrode adjacent to the second side 104 in the other first sub-group 11 by the second connecting portion 102 and the second connecting portion 102 passes through a region between the second sub-group 12 and the third sub-group 13 disposed between the two first sub-groups 11.

With this arrangement, first electrodes in two sub-groups included in a sub-pixel group emitting each color can be electrically connected by a corresponding second connecting portion, so as to avoid an intersection among the second connecting portions.

Optionally, referring to FIGS. 1 to 4, the pixel unit 10 includes a sub-pixel group emitting light of a first color, a sub-pixel group emitting light of a second color, and a sub-pixel group emitting light of a third color. The sub-pixel group emitting light of the first color includes two or more second sub-pixels 121 emitting light of the first color. The sub-pixel group emitting light of the second color includes two or more third sub-pixels 131 emitting light of the second color. The sub-pixel group emitting light of the third color includes two or more first sub-pixels 111 emitting light of the third color. The pixel unit 10 includes a plurality of sub-pixel units 20. Each of the sub-pixel units 20 includes a second sub-pixel 121 emitting light of the first color, a third sub-pixel 131 emitting light of the second color, and a first sub-pixel 111 emitting light of the third color which are adjacently disposed. The three sub-pixels 111, 121 and 131 in each sub-pixel unit 20 are arranged in a triangular shape.

The sub-pixel unit 20 includes a first region 21, a second region 22, and a third region 23. The first region 21 and the second region 22 are arranged in the first direction. The third region 23 and the first region 21 are arranged in the second direction. A central axis of the first region 21 and the second region 22 as a whole in the second direction substantially overlaps with a central axis of the third region 23 in the second direction. The central axis of the first region 21 and the second region 22 as a whole in the second direction refers to a central line of one side of the first region 21 and one side of the second region 22 which have the longest distance therebetween in the first direction. The central line extends along the second direction.

The second sub-pixels 121 emitting light of the first color are located in the first regions 21. The third sub-pixels 131 emitting light of the second color are located in the second regions 22. The first sub-pixels 111 emitting light of the third color are located in the third regions 23. In two sub-pixel units 20 adjacently arranged in the first direction, a third region 23 is located at the first side of the corresponding first region 21 and second region 22 in one of the two adjacent sub-pixel units 20; and a third region 23 is located at the second side of the corresponding first region 21 and second region 22 in the other sub-pixel unit 20. Third regions 23 in each alternate one of a plurality of sub-pixel units 20 arranged in the second direction are located on a same side of the corresponding first regions 21. Third regions 23 in each alternate one of a plurality of sub-pixel units 20 in the first direction are located on a same side of the corresponding first regions 21.

With this arrangement, in the first direction or the second direction, the second sub-pixels 121 emitting light of the first color, the third sub-pixels 131 emitting light of the second color, and the first sub-pixels 111 emitting light of the third color are uniformly distributed. This arrangement can avoid the problem of single-color bright stripes in a region, caused by color distribution unevenness derived from a plurality of sub-pixels with the same color being adjacent in a region of the transparent display substrate, and thus improve the display effect. In addition, the distribution of sub-pixels with a same color is relatively uniform, so that openings in a mask used for manufacturing light-emitting structures of the sub-pixels are arranged regularly, which can reduce the stretching wrinkles of the mask.

Optionally, when the pixel unit includes sub-pixel groups emitting light of three different colors, the three colors may be red, green and blue, respectively. The first color, the second color and the third color are one of the three colors respectively. For example, the first color is red, the second color is green, and the third color is blue; or, the first color is red, the second color is blue, and the third color is green and so on. In other embodiments, when the pixel unit includes sub-pixel groups emitting light of three colors, the three colors may be other colors. In some embodiments, the pixel unit may include sub-pixel groups emitting light of more than three colors.

In the embodiments shown in FIGS. 1 to 4, in order to arrange three adjacent sub-pixels emitting light of different colors in a triangular shape, a plurality of sub-pixels in some sub-groups are arranged in a staggered manner in the second direction. For example, two adjacent sub-pixels in the second sub-group 12 and the third sub-group 13 are arranged in a staggered manner in the second direction, that is, central axes of the two adjacent sub-pixels in the second direction do not overlap.

In another embodiment, in sub-groups included in each of a plurality of sub-pixel groups in a same first pixel unit 10, at least two sub-pixels in each sub-group are arranged side by side in the second direction, that is, central axes of the at least two sub-pixels in each sub-group in the second direction roughly overlap. Referring to FIG. 5, in the first pixel unit 10, a sub-pixel group emitting light of a first color includes two second sub-groups 12, and a plurality of second sub-pixels 121 emitting light of the first color included in each second sub-group 12 are arranged side by side in the second direction. A sub-pixel group emitting light of a second color includes two third sub-groups 13, and a plurality of third sub-pixels 131 emitting light of the second color included in each third sub-group 13 are arranged side by side in the second direction, that is, central axes of the plurality of third sub-pixels 131 emitting light of the second color included in each third sub-group 13 in the second direction roughly overlap. A sub-pixel group emitting light of a third color includes two first sub-groups 11, and a plurality of first sub-pixels 111 emitting light of the third color included in each first sub-group 11 are arranged side by side in the second direction, that is, central axes of the plurality of first sub-pixels 111 emitting light of the third color included in each first sub-group 11 in the second direction substantially overlap. In other embodiments, the arrangement of sub-pixels in each sub-pixel group and the manner for disposing the second connecting portion(s) may be different from those shown in FIGS. 1 to 5.

Optionally, the first direction and the second direction may be perpendicular to each other. The first direction may be a direction along a horizontal row, and the second direction may be a direction along a vertical column. Alternatively, the first direction may be a direction along a vertical column, and the second direction may be a direction along a horizontal row. In the drawings, the first direction being along a vertical column and the second direction being along a horizontal row are taken as an example for description, and other cases are not illustrated.

Figure 6:
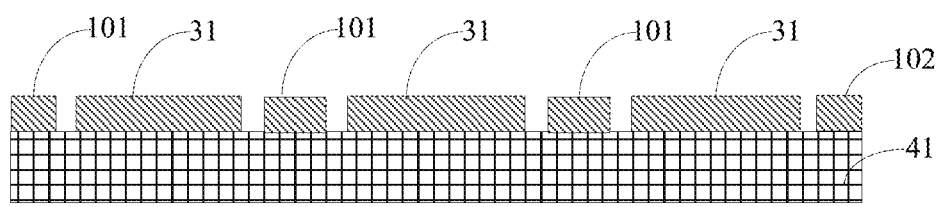
FIG. 6 is a cross-sectional view illustrating a transparent display substrate according to an embodiment of the present application.
Figure 7:
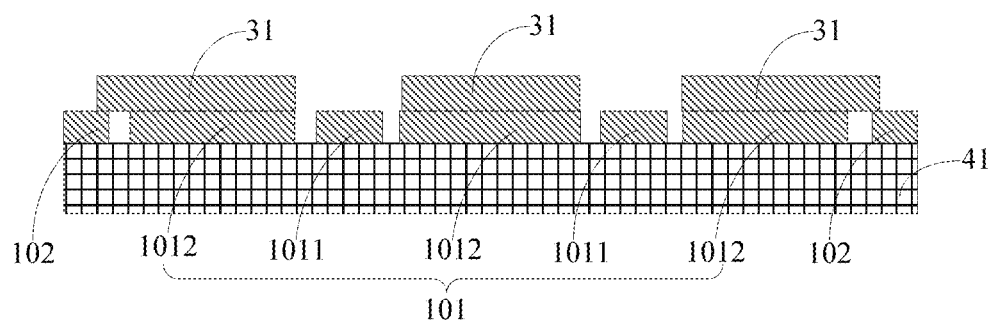
FIG. 7 is a cross-sectional view illustrating a transparent display substrate according to another embodiment of the present application, in which, a first connecting portion and a second connecting portion are located below a first electrode, and the first connecting portion and the second connecting portion are both in direct contact with the first electrode.
Figure 8:
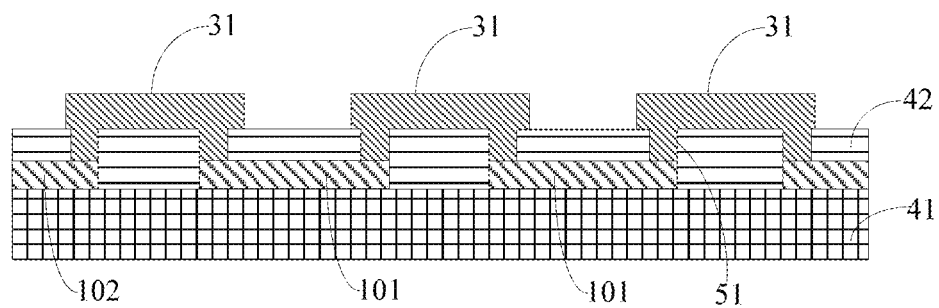
FIG. 8 is a cross-sectional view illustrating a transparent display substrate according to yet another embodiment of the present application, in which, a first connecting portion and a second connecting portion are located below a first electrode, an insulating layer is disposed between the first connecting portion and the first electrode, and the first electrode is electrically connected to the first connecting portion and the second connecting portion by through holes in the insulating layer.

Optionally, referring to FIGS. 6 to 8, the transparent display substrate includes a base 41, and a plurality of sub-pixels 111, 121 and 131 in the pixel units 10 are located on the base 41. First electrodes 31 of the plurality of sub-pixels 111, 121 and 131 may be anodes, and second electrodes thereof may be cathodes. The cathodes may be a planar electrode. The first connecting portion(s) 101, the second connecting portion(s) 102 and the first electrodes 31 may be disposed in the following manners.

In a first embodiment, as shown in FIG. 6, in the pixel units 10, the first connecting portions 101, the second connecting portion 102 and the first electrodes 31 of the sub-pixels 111, 121 and 131 are located in a same layer.

Further, sizes of the first connecting portion(s) 101 and the second connecting portion(s) 102 in a direction perpendicular to their extending directions may be greater than 3 μm, and less than half of a maximum size of the first electrodes 31. For example, the size of the first connecting portion in a direction perpendicular to its extending direction is a size of the first connecting portion on a plane extending along the first direction and the second direction, and the size of the second connecting portion in a direction perpendicular to its extending direction is a size of the second connecting portion on a plane extending along the first direction and the second direction. By setting the sizes of the first connecting portion(s) 101 and the second connecting portion(s) 102 in a direction perpendicular to their extending directions to be greater than 3 μm, resistances of the first connecting portion(s) 101 and the second connecting portion(s) 102 can be made relatively small. By setting the sizes of the first connecting portion(s) 101 and the second connecting portion(s) 102 to be less than half of the maximum size of the first electrodes 31, the arrangement of the first connecting portion(s) 101 and the second connecting portion(s) 102 has a relatively small effect on the sizes of the first electrodes 31, which avoids a reduction in the sizes of the first electrodes 31 caused by large sizes of the first connecting portion(s) 101 and the second connecting portion(s) 102, and further avoid a reduction in the effective light-emitting area of the transparent display substrate.

In an exemplary embodiment, the first connecting portion(s) 101, the second connecting portion(s) 102 and the first electrodes 31 are made of a same material, so that the first connecting portion(s) 101, the second connecting portion(s) 102 and the first electrodes 31 may be formed in one procedure, which can simplify the manufacturing process.

In another exemplary embodiment, the first connecting portion(s) 101 and the second connecting portion(s) 102 are made of a same material, so that the first connecting portion(s) 101 and the second connecting portion(s) 102 may be formed in one procedure. The first connecting portion(s) 101 and the first electrodes 31 are made of different materials, so that the first connecting portion(s) 101 and the first electrodes 31 may be formed in separate process steps.

In the second embodiment, as shown in FIG. 7, the first connecting portion(s) 101 and the second connecting portion(s) 102 are located below the first electrodes 31, and the first connecting portion(s) 101 and the second connecting portion(s) 102 directly contact the first electrodes 31 respectively. The first connecting portion 101 includes contact portions 1012 located below the first electrodes 31, and a wire 1011 for connecting two adjacent contact portions 1012. With this arrangement, the first connecting portion(s) 101 and the second connecting portion(s) 102 are located in different layers from the first electrodes 31, so that the arrangement of the first connecting portion(s) 101 and the second connecting portion(s) 102 is not affected by the first electrodes 31, and the wiring manner is more flexible. The sizes of the first electrodes 31 may not be affected by the first connecting portion(s) 101 and the second connecting portion(s) 102, so that the sizes of the first electrodes 31 can be made relatively large, and thereby the effective light-emitting area of the transparent display substrate can be made larger. The first connecting portion(s) 101 and the second connecting portion(s) 102 are in direct contact with the first electrodes 31, so that the first connecting portion(s) 101 and the second connecting portion(s) 102 are directly electrically connected to the first electrodes 31, which can make the structure simpler.

In the third embodiment, as shown in FIG. 8, the first connecting portion(s) 101 and the second connecting portion(s) 102 are located below the first electrodes 31, the first connecting portion(s) 101 and the first electrodes 31 have an insulating layer 42 disposed therebetween, and the first electrodes 31 are connected to the first connecting portions 101 and the second connecting portions 102 by through holes 51 in the insulating layer 42. The through holes 51 in the insulating layer 42 are filled with a conductive material, and the conductive material may be formed at a same time as the first electrodes 31. The first electrodes 31 are electrically connected to their corresponding first connecting portion 101 or second connecting portion 102 by the conductive material in through holes 51 below the first electrodes 31. With this arrangement, the first connecting portion(s) 101 and the second connecting portion(s) 102 are located in a different layer from the first electrodes 31, so that the arrangement of the first connecting portion(s) 101 and the second connecting portion(s) 102 is not affected by the first electrodes 31, which can make wiring manner more flexible. In addition, the sizes of the first electrodes 31 may not be affected by the first connecting portions 101 and the second connecting portions 102, so that the sizes of the first electrodes 31 can be made relatively large, and thereby the effective light-emitting area of the transparent display substrate can be made relatively large.

Optionally, the projection of the first electrodes 31 on the base may include one first graphic unit or a plurality of first graphic units connected with each other. The first graphic unit includes a circle, an oval, a dumbbell shape, a gourd shape or a rectangle. The dumbbell shape refers to a shape of a pattern formed by connecting two circles with two parallel straight lines which are located between the two circles and whose pitch is smaller than diameters of the two circles. The gourd shape refers to a shape of a pattern formed by directly connecting two circles and two parallel lines between the two circles with a distance smaller than the diameter of the two circles. When the first graphic unit is a circle, an oval, a dumbbell shape, or a gourd shape, the shapes can change the periodic structure of the diffraction, that is, change the distribution of a diffraction field, thereby weakening the diffraction effect produced when incident light from external passes through the transparent display substrate, and further ensuring that images taken by a camera disposed below the transparent display substrate have high definition.

Optionally, in the transparent display substrate, the projection of the light-emitting structure block disposed on the first electrode 31 on the base may include one second graphic unit or a plurality of connected second graphic units, and the second graphic unit and the first graphic unit may be same or different. In an embodiment, the projection of the light-emitting structure block correspondingly disposed on the first electrode 31 on the base is different from the projection of the first electrode 31 on the base, so as to further weaken the diffraction effect produced when light passes through the transparent display substrate.

Optionally, the second graphic unit may be a circle, an oval, a dumbbell shape, a gourd shape or a rectangle. When the second graphic unit is a circle, an oval, a dumbbell shape, or a gourd shape, the shapes can change the periodic structure of the diffraction, that is, change the distribution of a diffraction field, thereby weakening the diffraction effect produced when incident light from external passes through the transparent display substrate, and further ensuring that images taken by a camera disposed below the transparent display substrate have high definition.

In order to increase the light transmittance of the transparent display substrate, transparent materials may be used for each layer of the transparent display substrate. In this way, the light capturing of a photosensitive component such as a camera disposed below the transparent display substrate may be improved.

Optionally, the first electrode and/or the second electrode is made of a transparent material.

Further, the light transmittance of the transparent material for manufacturing the first electrode and/or the second electrode is greater than or equal to 70%. In an embodiment, the light transmittance of the transparent material is greater than or equal to 90%, for example, the light transmittance of the transparent material may be 90%, 95% or the like. Such an arrangement can make the light transmittance of the transparent display substrate larger, so that the light transmittance of the transparent display substrate meets the light capturing requirements of the photosensitive component disposed below the transparent display substrate.

Further, the transparent material for manufacturing the first electrode and/or the second electrode includes at least one of indium tin oxide, indium zinc oxide, silver-doped indium tin oxide, or silver-doped indium zinc oxide. In an embodiment, the transparent material for manufacturing the first electrode and/or the second electrode is silver-doped indium tin oxide or silver-doped indium zinc oxide, so as to reduce the resistance of the first electrode and/or the second electrode on the basis of ensuring the high light transmittance of the transparent display substrate.

Optionally, the light transmittance of the first connecting portion 101 and/or the second connecting portion 102 is greater than 70%. In an embodiment, the light transmittance of the first connecting portion 101 and/or the second connecting portion 102 is greater than or equal to 90%, for example, the light transmittance of the transparent material may be 90%, 95% or the like. Such an arrangement can make the light transmittance of the transparent display substrate larger.

Further, the material of the first connecting portion 101 and/or the second connecting portion 102 includes at least one of indium tin oxide, indium zinc oxide, silver-doped indium tin oxide, or silver-doped indium zinc oxide. In an embodiment, the transparent material for manufacturing the first connecting portion 101 and/or the second connecting portion 102 is silver-doped indium tin oxide or silver-doped indium zinc oxide, so as to reduce the resistance of the first connecting portion 101 and/or the second connecting portion 102 on the basis of ensuring the high light transmittance of the transparent display substrate.

An embodiment of the present application also provides a transparent display panel. The transparent display panel includes the above-mentioned transparent display substrate, and an encapsulation layer disposed on the transparent display substrate. The encapsulation layer is disposed on a side of the transparent display substrate facing away from the base.

The encapsulation layer may be a thin-film encapsulation structure, and the thin-film encapsulation structure may include a stacked layer formed by alternately stacking an organic material layer and an inorganic material layer. The organic material layer and the inorganic material layer are made of a transparent material. The material of the inorganic material layer may be $SiO_2$, $SiN_x$, $Al_2O_3$, etc., and the material of the organic material layer may be PI, PET, etc. The encapsulation layer may be a glass cover plate or a glass frit encapsulation structure.

Figure 9:
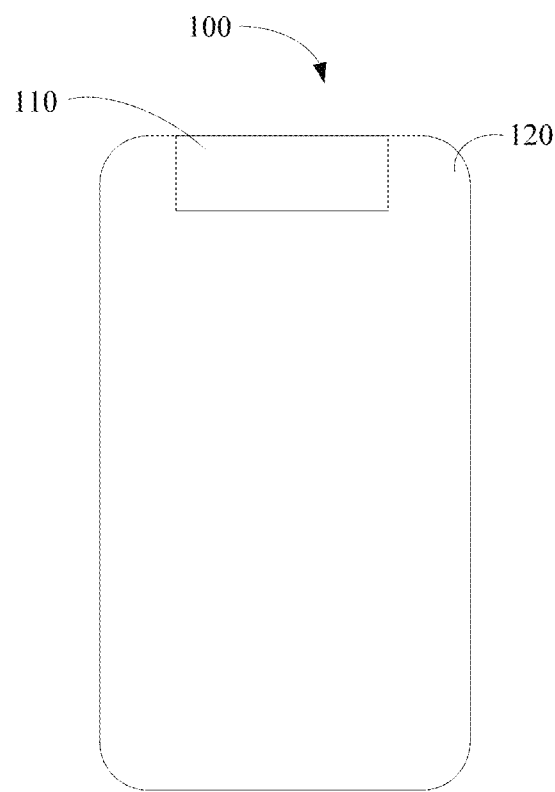
FIG. 9 is a top view illustrating a display device according to an embodiment of the present application.

An embodiment of the present application also provides a display device. Referring to FIG. 9, the display device 100 includes a first display region 110 and a second display region 120. The transparent display substrate is disposed in the first display region 110. The first display region 110 is a transparent display region. The second display region 120 is a transparent display region or a non-transparent display region. The light transmittance of the first display region 110 is greater than that of the second display region 120, and a photosensitive component may be disposed below the first display region 110.

Optionally, pixel circuits for driving sub-pixel groups of the transparent display substrate are disposed in the second display region. Such an arrangement helps to increase the light transmittance of the first display region, reduce the structural complexity of the first display region, and thereby weaken the diffraction generated when external light passes through the first display region.

The display device may include an encapsulation layer covering at least the second display region 120. The encapsulation layer may cover the first display region 110 and the second display region 120, or the encapsulation layer may cover the second display region 120 but not the first display region 110. The encapsulation layer may be a thin film encapsulation structure, a glass cover plate or a glass frit encapsulation structure.

The display device may further include a device body. The device body has a component region. The component region is located below the first display region, and one or more photosensitive components that collect light passing through the first display region are disposed in the component region.

The one or more photosensitive components may include a camera and/or a light sensor. In addition to the photosensitive components, a gyroscope, an earpiece or the like may be disposed in the component region. The component region may be a notched region, and the first display region may be disposed in close contact with the notched region, so that the one or more photosensitive components may emit or collect light passing through the first display region.

The present application is not limited to the precise structure that has been described above and shown in the drawings, and various modifications and changes can be made without departing from its scope. The scope of the application is limited only by the appended claims.

The invention claimed is:

1. A transparent display substrate, comprising:
   at least one pixel unit, wherein each of the at least one pixel unit comprises at least three sub-pixel groups emitting light of different colors respectively, each of the sub-pixel groups comprises at least two sub-pixels, and each of the sub-pixels comprises:
      a first electrode;
      a light-emitting structure block located on the first electrode; and
      a second electrode located on the light-emitting structure block,
   wherein in the at least one pixel unit, two first electrodes of two adjacent sub-pixels in one of the sub-pixel groups are electrically connected by a first connecting portion, and two first electrodes of two sub-pixels in another one of the sub-pixel groups are electrically connected by a second connecting portion, wherein the second connecting portion connects two sub-pixels in the another one of the subpixel groups and is at least partially surrounding sides of at least two sub-pixels of other sub-pixel groups, and
   the first connecting portion and the second connecting portion are located in a same layer.

2. The transparent display substrate according to claim 1, wherein the first connecting portion, the second connecting portion and the first electrode are located in a same layer,
   the first connecting portion, the second connecting portion and the first electrode are made of a same material; or
   the first connecting portion and the second connecting portion are made of a same material, and the first connecting portion and the first electrode are made of different materials.

3. The transparent display substrate according to claim 2, wherein a size of the first connecting portion in a direction perpendicular to an extending direction of the first connecting portion and a size of the second connecting portion in a direction perpendicular to an extending direction of the second connecting portion are respectively greater than 3 µm, and less than half of a maximum size of the first electrode.

4. The transparent display substrate according to claim 1, wherein the first connecting portion and the second connecting portion are located below the first electrode, and the first connecting portion and the second connecting portion are in direct contact with the first electrode.

5. The transparent display substrate according to claim 1, wherein the first connecting portion and the second connecting portion are located below the first electrode, the first connecting portion and the first electrode has an insulating layer disposed therebetween, and the first electrode is electrically connected to the first connecting portion and the second connecting portion by through holes in the insulating layer.

6. The transparent display substrate according to claim 1, wherein the first connecting portion and/or the second connecting portion have a light transmittance greater than 70%.

7. The transparent display substrate according to claim 6, wherein materials of the first connecting portion and/or the second connecting portion comprise at least one of indium tin oxide, indium zinc oxide, silver-doped indium tin oxide or silver-doped indium zinc oxide.

8. The transparent display substrate according to claim 1, wherein, in the at least one pixel unit, each of the another one sub-pixel group comprises at least two sub-groups arranged along a first direction, each of the sub-groups comprises at least two sub-pixels arranged at intervals along a second direction, two adjacent sub-groups in a same sub-pixel group have the sub-groups in other sub-pixel groups disposed therebetween, and the first direction intersects with the second direction.

9. The transparent display substrate according to claim 8, wherein two adjacent sub-pixels in a same sub-group are electrically connected by the first connecting portion, a first electrode in one of two adjacent sub-groups in the same sub-pixel group is connected to a first electrode in other one of the two adjacent sub-groups in the same sub-pixel group by the second connecting portion, and the second connecting portion at least partially surrounds sides of sub-groups in other sub-pixel groups.

10. The transparent display substrate according to claim 9, wherein each of the pixel units comprises a sub-pixel group emitting light of a first color, a sub-pixel group emitting light of a second color, and a sub-pixel group emitting light of a third color.

11. The transparent display substrate according to claim 10, wherein
   the sub-pixel group emitting light of the first color comprises one sub-group emitting light of the first color, the sub-pixel group emitting light of the second color comprises one sub-group emitting light of the second color, the sub-pixel group emitting light of the third color comprises two sub-groups emitting light of the third color,
   the sub-group emitting light of the first color and the sub-group emitting light of the second color are disposed between the two sub-groups emitting light of the third color, each of the pixel units comprises a first side and a second side opposite to the first side, and the first side is parallel to the second side along the first direction;
   a first electrode of a sub-pixel adjacent to the first side in one of the two sub-groups emitting light of the third color is electrically connected to a first electrode of a sub-pixel adjacent to the first side in the other one of the two sub-groups emitting light of the third color by the second connecting portion; and/or
   a first electrode of a sub-pixel adjacent to the second side in one of the two sub-groups emitting light of the third color is electrically connected to a first electrode of a sub-pixel adjacent to the second side in the other one of the two sub-groups emitting light of the third color by the second connecting portion.

12. The transparent display substrate according to claim 10, wherein the sub-pixel group emitting light of the first color comprises two sub-groups emitting light of the first color, the sub-pixel group emitting light of the second color comprises two sub-groups emitting light of the second color, the sub-pixel group emitting light of the third color comprises two sub-groups emitting light of the third color, sub-groups emitting light of two other colors are disposed between two sub-groups emitting light of a same color, each of the pixel units comprises a first side and a second side opposite to the first side, and the first side is parallel to the second side along the first direction;

a first electrode of a sub-pixel adjacent to the second side in one of the two sub-groups emitting light of the first color is electrically connected to a first electrode of a sub-pixel adjacent to the second side in other one of the two sub-groups emitting light of the first color by the second connecting portion, a first electrode of a sub-pixel adjacent to the first side in one of the two sub-groups emitting light of the second color is electrically connected to a first electrode of a sub-pixel adjacent to the first side in other one of the two sub-groups emitting light of the second color by the second connecting portion, and a first electrode of a sub-pixel adjacent to the first side in one of the two sub-groups emitting light of the third color is electrically connected to a first electrode of a sub-pixel adjacent to the second side in other one of the two sub-groups emitting light of the third color by the second connecting portion.

13. The transparent display substrate according to claim 12, wherein the sub-pixels in each of the sub-groups are arranged side by side in the second direction.

14. The transparent display substrate according to claim 10, wherein the sub-pixel group emitting light of the first color comprises more than two sub-pixels emitting light of the first color, the sub-pixel group emitting light of the second color comprises more than two sub-pixels emitting light of the second color, the sub-pixel group emitting light of the third color comprises more than two sub-pixels emitting light of the third color, each of the pixel units comprises a plurality of sub-pixel units, each of the sub-pixel units comprises a sub-pixel emitting light of the first color, a sub-pixel emitting light of the second color and a sub-pixel emitting light of the third color which are adjacently disposed and arranged in a triangular shape;

each of the sub-pixel units comprises a first region, a second region and a third region, the first region and the second region are arranged in the first direction, the third region and the first region are arranged in the second direction, a central axis of the first region and the second region as a whole in the second direction substantially overlaps a central axis of the third region in the second direction, the sub-pixel emitting light of the first color is located in the first region, the sub-pixel emitting light of the second color is located in the second region, and the sub-pixel emitting light of the third color is located in the third region;

in two adjacent sub-pixel units in the first direction, the third region is located at the first side of the corresponding first region and second region in one of the two adjacent sub-pixel units in the first direction, the third region is located at a second side, which is opposite to the first side, of the corresponding first region and second region in other one of the two adjacent sub-pixel units.

15. The transparent display substrate according to claim 14, wherein third regions in each alternate one of a plurality of sub-pixel units in the second direction are located on a same side of the corresponding first regions, and third regions in each alternate one of a plurality of sub-pixel units in the first direction are located on a same side of the corresponding first regions.

16. A transparent display panel, comprising:
the transparent display substrate according to claim 1; and
an encapsulation layer disposed on the transparent display substrate.

17. The transparent display panel according to claim 16, wherein the first connecting portions and the second connecting portions are located below the first electrodes, and the first connecting portions and the second connecting portions are in direct contact with the first electrodes.

18. The transparent display panel according to claim 16, wherein the first connecting portions and the second connecting portions are located below the first electrodes, an insulating layer is disposed between the first connecting portions and the first electrodes, and the first electrodes are electrically connected to the first connecting portions and the second connecting portions by through holes in the insulating layer.

19. A display device, comprising:
a first display region, wherein the first display region is a transparent display region, and a photosensitive component is disposed below the first display region; and
a second display region, wherein the second display region is a transparent display region or a non-transparent display region,
wherein the first display region and the second display region are provided with the transparent display substrate according to claim 1.

20. The display device according to claim 19, wherein pixel circuits for sub-pixel groups of the transparent display substrate are disposed in the second display region.

* * * * *